United States Patent [19]

Ebberg

[11] Patent Number: 4,896,327
[45] Date of Patent: Jan. 23, 1990

[54] METHOD FOR FREQUENCY STABILIZATION OF A SEMICONDUCTOR LASER COMPRISING A COUPLED EXTERNAL RING RESONATOR

[75] Inventor: Alfred Ebberg, Bochum, Fed. Rep. of Germany

[73] Assignee: Siemens Aktiengesellschaft, Berlin and Munich, Fed. Rep. of Germany

[21] Appl. No.: 228,062

[22] Filed: Aug. 4, 1988

[30] Foreign Application Priority Data

Aug. 25, 1987 [DE] Fed. Rep. of Germany ....... 3728349

[51] Int. Cl.$^4$ ................................................. H01S 3/13
[52] U.S. Cl. .......................................... 372/32; 372/94
[58] Field of Search .................. 372/32, 94, 33, 29, 372/93, 28, 108, 31; 350/96.15; 356/350

[56] References Cited

U.S. PATENT DOCUMENTS

| | | | |
|---|---|---|---|
| 4,299,490 | 11/1981 | Cahill et al. | 356/350 |
| 4,545,682 | 10/1985 | Greenwood | 356/350 |
| 4,588,296 | 5/1986 | Cahill et al. | 350/96.15 |
| 4,661,964 | 4/1987 | Haavisto | 372/94 |
| 4,666,295 | 5/1987 | Duvall, III et al. | 372/32 |
| 4,702,600 | 10/1987 | Handrich et al. | 356/350 |

FOREIGN PATENT DOCUMENTS 0063514 4/1984 Japan ...................................... 372/94

OTHER PUBLICATIONS

Stokes et al., "All-Single-Mode Fiber Resonator", *Optic Letters*, vol. 7, No. 6, Jun. 1982, pp. 288-290.
Tai et al., "Simultaneous Stabilization of Spectral Linewidth and Oscillation Frequency of an External-Cavity Laser Diode by Fiber-Optic Ring Resonators", *Proc. of IOOC-ECOC '85*, 1985, pp. 833-836.
Ji et al., "Acousto-Optic Frequency Shifting in Ordinary Single-Mode Fibre", *Electronics Letters*, Oct. 9, 1986, vol. 22, No. 21, pp. 1141-1142.
Kim et al., "All-Fiber Acousto-Optic Frequency Shifter", *Optics Letters*, vol. 11, No. 6, Jun. 1986, pp. 389-391.
Meyer et al., "Passive Fiber-Optic Ring Resonator for Rotation Sensing", *Optics Letters*, vol. 8, No. 12, Dec. 1983, pp. 644-646.
Shupe, "Thermally Induced Nonreciprocity in the Fiber-Optic Interferometer", *Applied Optics*, vol. 19, No. 5, Mar. 1, 1980, pp. 654-655.

*Primary Examiner*—Frank Gonzalez
*Attorney, Agent, or Firm*—Hill, Van Santen, Steadman & Simpson

[57] ABSTRACT

A method for frequency stabilization of a semiconductor laser having a coupled, external ring resonator, which stabilizes the emission frequency of the semiconductor utilizes a stabilizing of the free spectral range and the resonant frequencies of the ring resonator in order to correct for changes due to temperature fluctuations. To accomplish this, a shift in resonant frequency from a predetermined value and a shift in the free spectral range from a rated value is compensated by utilizing a phase modulator to act on the resonator to shift the frequencies back to the predetermined frequencies.

14 Claims, 2 Drawing Sheets

METHOD FOR FREQUENCY STABILIZATION OF A SEMICONDUCTOR LASER COMPRISING A COUPLED EXTERNAL RING RESONATOR

BACKGROUND OF THE INVENTION

The present invention is directed to the frequency stabilization of a semiconductor laser, for example, a semiconductor laser diode. Frequency stability can be increased by a stabilization of both the injection current as well as the crystal temperature and is enhanced so that it is adequate for many applications. However, the remaining frequency fluctuations can amount to a few 100 MHz. When high demands are made of frequency consistancy, then one must fall back to stabilization with the assistance of external, frequency-stabilized resonators.

Ring resonators that can achieve extremely high quality can be realized upon employment of monomode optical fibers, as disclosed by *Optics Letters*, Vol. 7, June 1982, pages 288–290. The transmission and reflective behavior of the ring resonator is very similar to that of a Fabry-Perot resonator so that the fiber ring resonator, among other things, can be utilized in order to stabilize the emission frequency of semiconductor laser diodes, as disclosed, for example, from *Proc. of IOOC-ECOC 1985*, pages 833–836. Since, however, the refractive index of the optical fiber exhibits a great temperature dependency, fiber resonators react to temperature fluctuations with great modifications of the resonant frequency, and this will also involve a modification of the free spectral range that is defined by the frequency spacing between two neighboring resonant frequencies of the resonator and is equal to c/nl, wherein c is the speed of light in a vacuum, n is a refractive index of the one, annularly closed, optical waveguide of the resonator, and l is the length of the waveguide. The frequency stability of the laser diode stabilized in this fashion is not adequate for many applications, for example, for optical heterodyne detection, so that additional stabilization measures must be undertaken.

The stabilization of the free spectral range and, thus, of the resonant frequency of an optical resonator was heretofore achieved by the stabilization of the resonator length. This is usually achieved by realizing a temperature-compensating structure that uses invar rods or silica glass rods. However frequency stability in a fiber ring resonator is essentially defined by relatively great temperature dependency of the refractive index of the fiber. Operating such a resonator at a constant ambient temperature has hitherto been the only known possiblity of frequency stabilization.

SUMMARY OF THE INVENTION

The object of the present invention is to provide a method and apparatus for stabilizing the emission frequency of the semiconductor laser that can be achieved on the basis of stabilization of the free spectral range and, thus, of the resonant frequencies of the ring resonator coupled to the laser independent of temperature fluctuations.

This object is achieved for a method of frequency stabilization of a semiconductor laser having an output coupled into an external ring resonator having resonant frequencies and having means for stabilizing resonant frequencies of the ring, including the phase modulator, the method includes stabilizing the frequency of the laser and stabilizing the free spectral range of the resonator to stabilize the resonant frequencies by utilizing a reference frequency corresponding to a rated value or a integer multiple of this rated value and continuously controlling the rated value by operating the phase modulator to shift the resonant frequencies of the resonator.

To stabilize the free spectral range of the resonator, a laser output is split into a first beam and a second beam having a frequency, the first beam has its frequency offset by a reference frequency to produce a frequency shifted wave, which is coupled into the ring resonator and a determination is made whether this wave circulating in the resonator in one direction with the offset frequency will be of a resonant frequency of the resonator or not. Light coupled out due to not being of the resonant frequency will be measured and used to operate the phase modulator to shift the resonant frequency of the resonator until a zero output of light is coupled from the ring.

In a further modification of the device, the second beam is coupled in the second direction into the ring resonator to circulate therein and in a direction opposite to the first-mentioned wave and a measurement is made to see whether this second wave circulating in the opposite direction will excite a resonance in the resonator with a non-exciting of the resonance causing light of the second beam to be coupled out. This modification is based on the fact that two oppositely running waves in a ring resonator exhibit resonant phenomena independent of one another, whereby the resonant frequencies coincide as long as the light propagation in the fiber is reciprocal.

The identification whether the frequency of the frequency offset wave or the frequency of the other or second wave running opposite thereto coincide with the respective allocated resonant frequencies can occur as follows. The portion of the offset beam that is coupled out of the ring is detected and the output corresponds to a power component that can be coupled out of the resonator and this component of the frequency shifted wave circulating in one direction is used to actuate the phase modulator. In a similar manner, the portion of the second wave is also detected.

In order to shift the resonant frequencies of the ring and for determining whether the frequency of the frequency shifted wave or the other wave coincide with the respective allocated resonant frequencies, the phase modulator has a constant frequency applied, and is actuated in conjunction with a measured value of the light coupled out from the shifted wave. In order to control the output of the laser, the measured light of the second wave that is coupled out of the resonator is used to control the frequency output of the laser.

In order to shift the frequency of the first beam, the first beam is applied to an acousto-optical modulator. Instead of passing it through an acousto-optical modulator which applies the reference frequency, the shifting of the frequency of the first beam can be accomplished by a reference frequency shift with a Bragg cell. Instead of utilizing a Bragg cell, it is also possible to shift the frequency of the first beam by utilizing a fiber optical frequency shifter.

Preferably, the phase modulator is composed of a piezoelectric control element that pinches and influences the annular closed optical waveguide of the ring resonator and is driven by a reference signal and a signal determined by the measured outcoupled light of the first beam from the resonator.

Other features and advantages of the invention will be readily apparent from the following description of the preferred embodiments, the claims and drawings.

DESCRIPTION OF THE PREFERRED EMBODIMENTS

Figure 1:
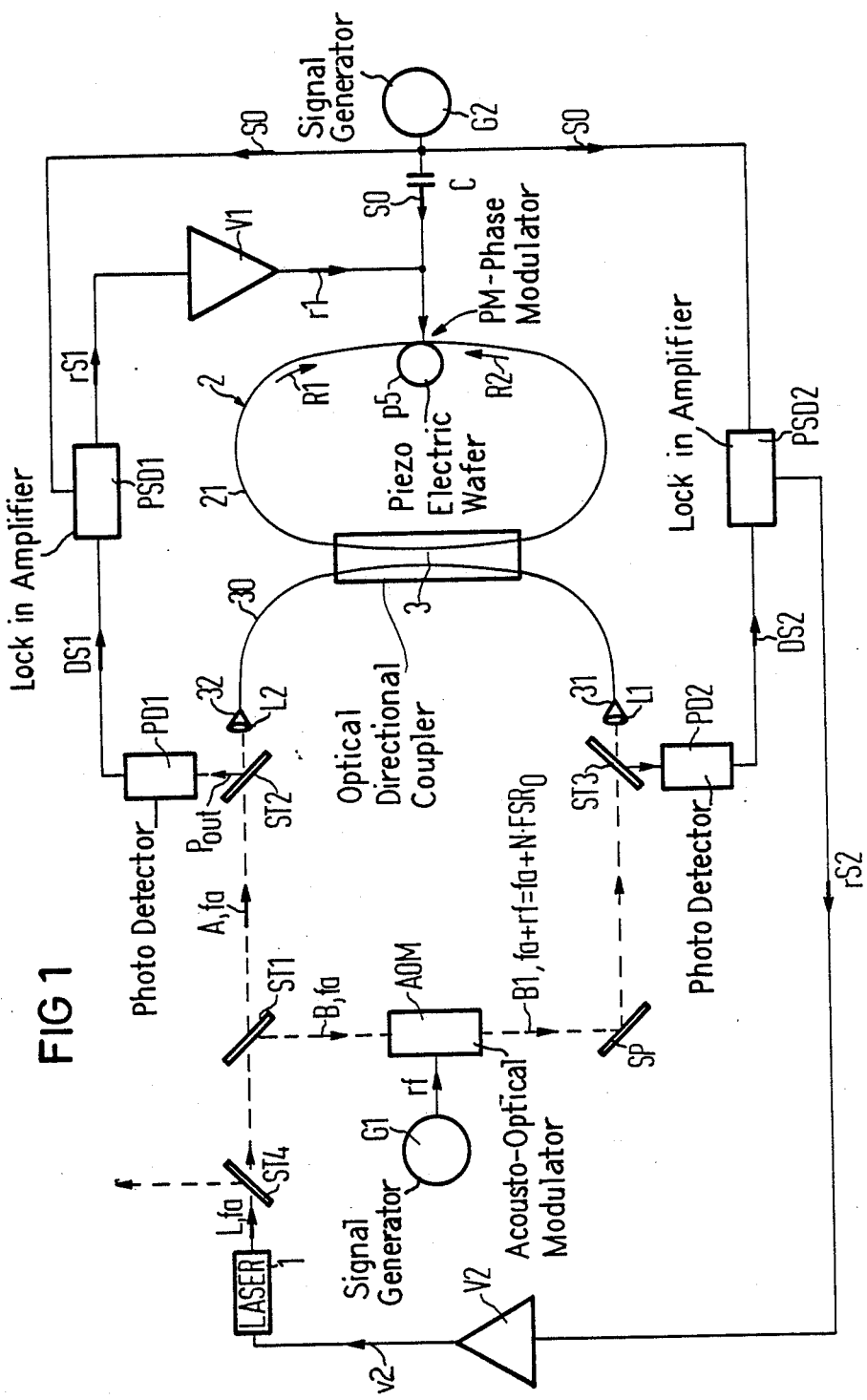
FIG. 1 is a diagrammatic presentation of an arrangement for implementing the method in accordance with the present invention.

The principles of the present invention are particularly useful when incorporated in an apparatus, illustrated in FIG. 1, which has a semiconductor laser 1 and a ring resonator, generally indicated at 2. The ring resonator 2 is composed of an annularly closed monomode fiber 21, which has a portion extending through an optical directional coupler 3 for coupling optical power into and out of the resonator 2.

The optical directional coupler 3 is constructed so that a second monomode fiber 30, having two ends 31 and 32, runs at a slight distance next to the annular closed fiber 21 of the resonator 2 over a defined distance so that a slight spacing in dimension exists and that optical power can couple between the two fibers in a defined coupling length. The ends 31 and 32 of the second monomode fiber 30 each serve for coupling optical power into or, respectively, out of the resonator 2.

When, for example, an optical power is coupled in via one end 31 of the second or additional fiber 30, this power couples at least partially into the annularly closed fiber 21 in the directional coupler 3 and circulates in this fiber 21 in the direction R1, which is illustrated as being in a clockwise direction. This circulating optical power can, under certain conditions, be coupled from the fiber 21 again at the directional coupler 3 and can be taken from the second or other end 32 of the fiber 30. How much optical power is coupled out of the annularly closed fiber depends on the frequency of the power coupled in.

Figure 2:
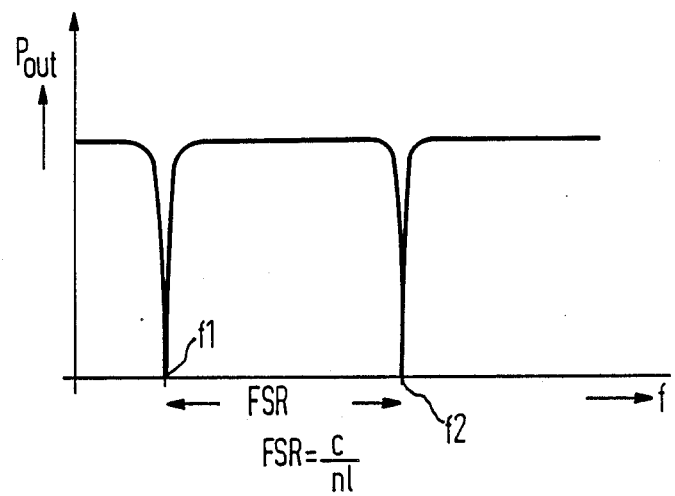
FIG. 2 is a graphic illustration of the resonance behavior of the resonator.

FIG. 2 graphically illustrates the resonant behavior of the resonator 2. In this Figure, the power $P_{out}$, which is coupled from the end 32, is shown as a function of the frequency f of the power coupled in at the end 31 of the fiber 30. In accordance therewith, there are defined or specific resonant frequencies f1 and f2, etc., at which the in-coupled power excites a resonance of the resonator 2. This means that no optical power is coupled out via the directional coupler at the end 32. When, by contrast, the frequency of the in-coupled power falls between the two neighboring resonant frequencies f1 and f2 of the resonator 2, then the power does not excite any resonance in the resonator and it can be entirely, or at least partially coupled out via the directional coupler and out the end 32.

The same is true when the optical power is coupled in via the end 32 of the fiber 30 and circulates in the fiber 21 in the direction R2, which is indicated as a counterclockwise direction, and is then coupled out via the directional coupler 3 and the end 31. As already mentioned, two waves circulating in opposite directions in the fiber 21 generate resonant phenomenon independent of one another so that the resonant frequencies f1 and f2, etc., coincide for both waves, as long as the light propagation in the fiber is reciprocal.

A greater detail of the operation of the apparatus of FIG. 1 is set forth hereinafter. An optical wave L having a frequency fa is emitted by the monomode semiconductor laser 1 and is partially conducted to a first beam splitter ST1 that splits this wave into a first wave B having a frequency fa and a second wave A having a frequency fa.

Figure 3:
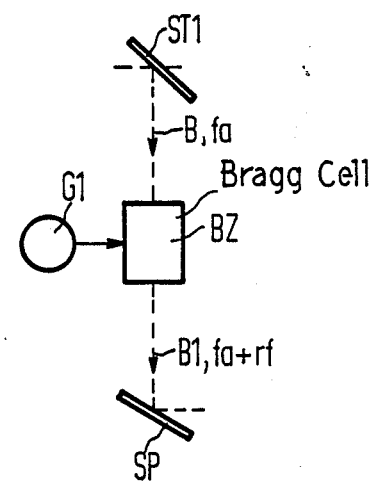
FIG. 3 is a modification of a portion of the arrangement of FIG. 1 utilizing an acousto-optical modulator in the form of a Bragg cell.
Figure 4:
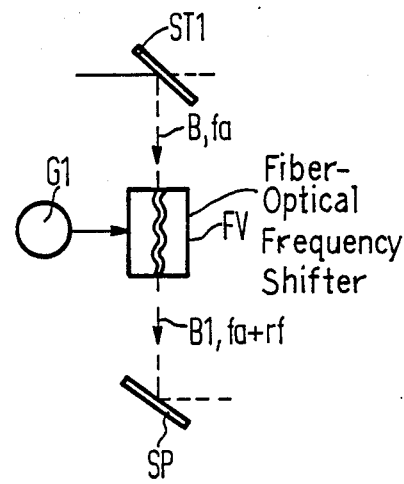
FIG. 4 is a portion of the arrangement of FIG. 1 showing a modification utilizing a fiber optical wave shifter.

The first or one wave B is directed towards an acousto-optical modulator AOM that is driven by an electrical signal having a reference frequency rf that is generated by a signal generator G1. The acousto-optical modulator will shift the frequency fa of the first wave B by the reference frequency rf so that a shifted wave B1 emerging from the acousto-optical modulator AOM has a frequency fa+rf that is offset by the reference frequency rf. The frequency shifter in the form of an acousto-optical modulator can also be a Bragg cell BZ, as illustrated in FIG. 3. Instead of the frequency shifter in the form of an acousto-optical modulator, a fiber optical frequency shifter FV, as illustrated in FIG. 4, can be utilized, as disclosed in *Electronic Letters*, Oct. 9, 1986, Vol. 22, No. 21, pp. 1141–1142, or *Opt. Lett.*, June 1986, Vol. 11, No. 6, pp. 389–391.

The frequency shifted wave B1, which is produced by the first beam B passing through the acousto-optical modulator, is supplied to an incoupling lens L1, which is positioned adjacent the end 31 of the fiber 30. In order to deffect the shifted beam B1, it may be deflected utilizing a deflecting mirror SP and a beam splitter ST3. The lens L1 focusses a frequency-shifted wave B1 onto the end 31 of the fiber 30 so that this wave B1 is coupled into the fiber. The coupled-in, frequency-shifted wave B1 couples into the annularly closed fiber 21 of the resonator 2 via the directional coupler 3 and will ciculate in the direction R1 therein.

Given the assumption that the frequency fa coincides with the resonant frequency f1 of the resonator 2 and that its free spectral range FSR is equal to the rated frequency $FSR_0$ of this range, the frequency-shifted wave B1 excites a resonance in the resonator 2 when the reference frequency rf is set to $rf=N.FSR_0$, wherein N is an integer number unequal to 0. This means that no power can be coupled out at the end 32 of the fiber 30. Without limitations of the universality, we will assume N=1 for the following description.

Due to temperature variations, the resonant behavior of the resonator 2 is changed so that its resonant frequency f1 and f2 are shifted and its free spectral range FSR no longer coincides with the rated frequency $FSR_0$. When these changes are adequately great, then the frequency fa and fa+rf do not excite any resonance in the resonator 2.

In this case, the optical power coming from the wave B1 can be taken from the end 32 of the fiber 30. This optical power is capable of being measured with an opto-electrical detector or photodetector PD1, for example a photodiode, and contains information about the deviation of that resonant frequency f2 of the resonator 2 that lies closest to the frequency fa+rf of the frequency shifted wave B1 and is, thus, allocated to this frequency fa+rf. As already indicated, the resonant frequency f1 of the resonator 2 also deviates from the allocated closest frequency fa.

The deviation of the resonant frequency f2 from the allocated frequency fa+rf=fa+FSR$_0$ can be identified with a phase-sensitive detection and with the phase modulator PM arranged on or at the resonator 2. To this end, the output signal DS1 of the photodetector PD1 is supplied to a lock-in amplifier PSD1, to which an electrical signal SO, having a definite frequency fo, is supplied from a signal generator G2 a a reference signal that simultaneously controls the phase modulator PM that, for example, can be a voltage-controlled, piezoelectric wafer or disc p5 that exerts a pinching pressure on the fiber 21, dependent on the reference signal SO. The output signal rS1 of the lock-in amplifier PSD1 indicates the deviation of the resonance frequency f2 of the resonator 2 from the allocated frequency fa+rf, and can be supplied to the control unit V1 as a control signal. The amplifier V1 has an output signal r1 that is applied for controlling the phase modulator PM so that it, thus, controls the resonant behavior of the resonator 2 until the deviation will disappear so that the resonant frequencies f1 and f2, again, coincide with the allocated frequency fa or, respectively, fa+rf and, as a result thereof, the free spectral range FSR of the resonator is equal to the rated value FSR$_0$. In this way the free spectral range of the resontor 2 can be controlled to the rated value FSR$_0$.

The output signal r1 of the control unit V1 can be supplied to the same input of the phase modulator PM as the reference signal SO, having the defined frequency fo of the signal generator G2 when this reference signal SO is applied to the phase modulator PM via a decoupling capacitor C.

It is expendient to also identify deviation of the resonant frequency f1 of the resonator 2 from the allocated frequency fa that can be used for controlling the semiconductor laser 1 onto the frequency fa. This latter deviation can be identified in the same way as the above-mentioned deviation and is identified by a phase-sensitive detection and the phase modulator PM.

To that end, the other or second wave A, having the frequency fa, is directed towards a lens L2 via a beam splitter ST2, which serves the purpose of coupling power out of the end 32. The lens L2 focusses this second wave A onto the end 32 of the fiber 30 so that it is coupled into the fiber 30. This incoupled, second wave A will couple at least partially into the annularly closed fiber 21 of the resonator 2 in the directional coupler 3 and circulates therein at a direction R2, which is indicated as a counter-clockwise direction. Dependent upon whether the waves circulating in this direction R2 excites a resonance in the resonator 2 or not, no optical power or, respectively, greater or lesser optical powers can be coupled out from this circulating wave via the directional coupler 3 at the end 31 of the fiber 30. A power coupled out of the end 31 of the fiber 30 contains information about the difference between the frequency fa of the second wave A and the resonant frequency f1 of the resonator 2 lying closest to it and, thus, allocated to it. This out-coupled power can, likewise, be measured with an opto-electrical detector PD2, which can be a photodetector or a photodiode.

The difference between the frequency fa of the second wave A and the allocated resonant frequency f1 can, again, be identified with the phase-sensitive detection and with the phase modulator PM arranged in the resonator 2. To that end, for example, an output signal DS2 of the detector PD2 is supplied to the lock-in amplifier PSD2 to which the signal SO of the generator G2 is likewise supplied as a reference signal. The output signal rS2 of the lock-in amplifier PSD2 provides the difference between the frequency fa and the allocated frequency f1 of the resonator 2 and can be supplied to a control unit V2 as a control signal. The output signal v2 of the control unit V2 is used to control the semiconductor laser 1, such that the difference disappears and a frequency fa corresponds with the allocated resonant frequency.

The two beam splitters ST2 and ST3 only serve the purpose that the optical power can be directed towards the ends 31 and 32 of the fiber 30 and that, independent thereof, power coupled out of these ends 31 and 32 can be directed towards the detectors, such as PD1 or PD2, respectively.

The beam splitter ST4 is only necessary when the resonator 2 is arranged at the side of the laser 1 at which the laser power, i.e., the wave L is taken from the laser. When the resonator 2 is arranged at that side of the laser 1 facing away from this side, the beam splitter ST4 is not required.

The beam splitters ST1–ST4, in the apparatus of FIG. 1, are partially reflecting mirrors arranged obliquely relative to the propagation direction of the light. Instead of using partially reflecting mirrors, the beam splitting can be accomplished by using optical directional couplers, particularly an optical fiber directional coupler. It is also advantageous to manufacture the annularly closed fiber 2, the directional coupler 3 and the beam splitters, as well as the form of the directional couplers from polarization-preserving monomode optical fibers.

In the arrangement of FIG. 1, and in the apparatus of the invention in general, the degree of stabilization is essentially defined by the uncertainty $\Delta f$ in the measurement of the free spectral range FSR. For example, the frequency spacing between two neighboring resonant frequencies of the resonator. The theoretical value $\Delta f$ can be achieved that amounts to about 0.1 Hz. Experimentally, resonant frequencies having an uncertainty of $\Delta f$ of about 2 Hz have hitherto been able to be measured, as disclosed by R. E. Meyer, S. Ezekiel, D. W. Stowe, V. J. Tekippe, "Passive Fiber-Optic Ring Resonator for Rotation Sensing", *Optics Letters*, Vol. 8, December 1983, pp. 644–646. The uncertainty $\delta f$ in the resonant frequency then occurs at $$\delta f = \Delta f \frac{fa}{N \cdot FSR}$$

with fa=$2 \cdot 10^{14}$ Hz, which corresponds to the wavelength of 1.5 $\mu$m, as well as with N.FSR=100 MHz and $\Delta f$=1 Hz, $\delta f$ derives at $$\delta f = 2 MHz$$

without this active stabilization, $\delta f$ will occur at $$\delta f = 2 GHz/^\circ K$$

the temperature coefficient dn/dT of the refractive index n of a waveguide of the resonator was thereby assumed at $$dn/dT = 10^{-5}/^\circ K$$

as disclosed by D. M. Shupe, "Thermally Induced Nonreciprocity in the Fiber-Optic Interferometer", *Applied Optics*, Vol. 19, March 1980, pp. 654–655. The uncertainty δf, given an active stabilization of the spectral range, is small enough in order, for example, to be able to adequately well stabilize, for example, a semiconductor laser diode in an optical heterodyne system without control via the intermediate frequency signal.

Although various minor modifications may be suggested by those versed in the art, it should be understood that I wish to embody within the scope of the patent granted hereon all such modifications as reasonably and properly come within the scope of my contribution to the art.

I claim:

1. A method for stabilizing an emission frequency of a semiconductor laser with an external ring resonator, said laser having an output coupled to said external ring resonator having resonant frequencies, means for stabilizing the resonant frequencies of the ring resonator including a phase modulator, said output of the laser being a wave of a frequency approximately of one of the resonant frequencies, said method including splitting the wave into a first portion and a second portion; stabilizing a free spectral range of the resonator to stabilize the resonant frequencies by passing the first portion of the wave through means for shifting the frequency of the wave by a reference frequency corresponding to a whole multiple of a rated value of the free spectral range to create a frequency shifted wave, coupling the frequency-shifted wave into the ring resonator to propagate in one direction and to excite a resonance of the resonator, when non-excitation of the resonant frequency occurs, using a decoupled portion of the first wave to control the modulator to shift the resonant frequencies of the resonator and continuously control the value of the free spectral range; and stabilizing the frequency of the laser by coupling the second portion into the ring resonator to travel in a direction opposite to the shifted wave to excite a resonance in the resonator, given a non-excitation of a resonance by the second portion, taking the uncoupled second portion and utilizing it to control the frequency of the laser.

2. A method according to claim 1, wherein the phase modulator is composed of a piezo-electric control element and control of the modulator includes applying electrical control signals to the control element to mechanically influence an annularly closed optical waveguide of the ring resonator.

3. A method according to claim 1, wherein the step of using the first and second portion of the waves coupled from the resonator because of a non-excitation of resonance, includes detecting the light coupled from the resonator in each direction, creating a detection signal for each of the directions, utilizing the detection signal from the first portion with a reference signal having a defined constant frequency for a phase-sensitive detection to control the phase modulator.

4. A method according to claim 3, wherein the shifting of the resonant frequencies of the ring resonator and for determining whether the frequencies in the first portion coincide with respective allocated resonant frequencies includes conducting the reference signal to the phase modulator via a decoupling capacitor.

5. A method according to claim 1, wherein the step of shifting a first portion to create the shifted wave comprises passing the first portion through an acousto-optical modulator which shifts the first portion by a reference frequency.

6. A method according to claim 1, wherein the step of shifting the frequency of the first portion comprises utilizing a Bragg cell to shift the first portion.

7. A method according to claim 1, wherein the step of shifting the first portion from the laser by a reference frequency comprises applying the reference frequency to a fiber optical frequency shifter.

8. An apparatus comprising a semiconductor laser having a laser beam of an emission frequency, means for shifting the frequency of a first portion of the laser beam and means for stabilizing the emission frequency, said means for stabilizing including an external ring resonator having resonace frequencies, first means for coupling the first portion of the laser beam into the ring resonator to travel in a first direction, second means for coupling a second portion of the laser beam into the ring resonator to travel in a second direction opposite the first direction, third means for detecting light traveling in the first direction being coupled out due to non-exciting of the resonance in the ring resonator, fourth means for detecting light traveling in the second direction being coupled out due to non-exciting of the resonance in the ring resonator and a phase modulator acting on the ring resonator to change the resonant frequencies in response to a signal created by the third means for detecting light coupled from the resonator traveling in the first direction.

9. An apparatus according to claim 8, wherein the means for shifting the frequency comprises an acousto-optical modulator.

10. An apparatus according to claim 8, wherein the means for shifting the frequency comprises a Bragg cell.

11. An apparatus according to claim 8, wherein the means for shifting the frequency includes a fiber optical frequency shifter.

12. An apparatus according to claim 8, wherein the modulator includes a piezo-electric element mechanically coupled to the resonator ring to apply mechanical forces thereto to change the resonant frequencies.

13. An apparatus according to claim 12, which includes a generator creating a reference signal, a lock-in amplifier receiving said reference signal and an output signal from said third means, said lock-in amplifier having an output being applied to the piezo-electric element.

14. An apparatus according to claim 13, which includes an additional lock-in amplifier receiving said reference signal from the generator, said fourth means for detecting light being coupled out of the resonator travelling in the second direction creates a signal applied to the additional lock-in amplifier, said additional lock-in amplifier producing a combined signal applied to the laser to control the frequency of the laser beam.

* * * * *